United States Patent [19]
Shibasaki et al.

[11] 3,773,577
[45] Nov. 20, 1973

[54] COMPOSITION FOR ETCHING COPPER WITH REDUCED SIDEWAYS-ETCHING

[75] Inventors: Yasuichi Shibasaki; Koichi Oyama, both of Yokohama, Japan

[73] Assignee: Nippon Peroxide Co., Ltd., Tokyo, Japan

[22] Filed: Apr. 11, 1972

[21] Appl. No.: 243,069

[30] Foreign Application Priority Data

May 13, 1971 Japan .............................. 46/31583

[52] U.S. Cl. .......................... 156/8, 156/3, 156/18, 252/79.4

[51] Int. Cl. .............................................. C23f 1/02

[58] Field of Search ....................... 156/3, 8, 18, 14, 156/19; 252/79.4

[56] References Cited

UNITED STATES PATENTS

| | | | |
|---|---|---|---|
| 3,597,290 | 8/1971 | Akira Naito et al. | 252/79.4 X |
| 3,668,131 | 6/1972 | Banush et al. | 252/79.4 |

*Primary Examiner*—William A. Powell
*Attorney*—Norman F. Oblon et al.

[57] ABSTRACT

An etching bath composition which reduces the extent of side or lateral etching is prepared by admixing an additive selected from a group consisting of aliphatic amines having a straight chain of more than four carbon atoms, cyclohexylamine, benzotriazole or N,N-dialkylaniline, with a basic composition of sulfuric acid and hydrogen peroxide.

4 Claims, No Drawings

COMPOSITION FOR ETCHING COPPER WITH REDUCED SIDEWAYS-ETCHING

BACKGROUND OF THE INVENTION

1. Field Of The Invention

This invention relates to an etching composition and to a method for etching copper or alloys containing copper, and more particularly to a sulfuric acid-hydrogen peroxide type etching composition which is capable of etching copper or copper containing alloys with minimal side-etching.

2. Description Of The Prior Art

Etching techniques for the etching of copper and copper containing alloys are quite important to the electronics industry, particularly for the preparation of printed circuit boards. In general, printed circuit boards are prepared by applying a copper foil, ordinarily a 15μ/105μ copper foil, onto an insulating base, usually made of phenolic or epoxy resin reinforced with glass, paper or flexible film. The foil is then selectively covered with a photoresist resin, exposed to light, and the exposed portion is developed. A solder alloy is plated onto the protected portion of the copper and the exposed portion of the copper is subjected to etching. Etching is accomplished by any of a variety of conventional techniques, including soaking, puddling, spraying, or the like, after appropriately protecting portions of the foil with a photoresist, solder alloy (usually a 55/80% Sn–20/45% Pb alloy) or a printing ink.

Heretofore, ferric chloride, ammonium persulfate or mixture of chromic acid and sulfuric acid have been used for etching copper. None of these prior art etching solutions, however, have proven to be completely satisfactory for preparing close tolerance and high performance circuit boards. Ferric chloride cannot be used with certain types of resist materials, such as solder alloys. Ammonium persulfate or chromic acid results in formation of objectionable pollutants.

It has also been considered to use sulfuric acid-hydrogen peroxide type etching solutions. While this type of solution has certain advantageous features, notably that it can be used with a solder alloy resist without discoloration of the solder alloy, high etching rates, good economy and easy copper recovery following etching, it has a tendency to effect fairly extensive sidewise or lateral etching and can severely undercut the resist. If the etching period is sufficiently long, the solution is liable to etch into the copper along the side edges beneath the resist which can cause considerable difficulties in the final product.

It would be desirable, therefore, to provide a sulfuric acid-hydrogen peroxide type etching solution which has a minimal tendency toward side or lateral etching and undercutting of the resist.

SUMMARY OF THE INVENTION

Accordingly, it is one object of this invention to provide a sulfuric acid-hydrogen peroxide type composition for etching copper which is effective for preventing side or lateral etching and undercutting of the resist, so as to enable the preparation of a close tolerance and high quality printed circuit board.

It is another object of this invention to provide a method for etching copper whereby the degree of lateral or side etching and the extend of undercutting of the resist is minimized.

These and other objects, as will hereinafter become more readily apparent, have been attained by admixing greater than 0.01% w/v of an aliphatic amine having a straight chain portion of more than four carbon atoms, or N,N-dialkyline, cyclohexylamine, or benzotriazole with a basic composition containing sulfuric acid and hydrogen peroxide.

[% w/v = (percent weight/volume of a basic composition)]

DETAILED DESCRIPTION OF THE PREFERRED EMBODIMENTS

The amine additive used with the hydrogen peroxide-sulfuric acid solution may be an aliphatic amine, N,N-dialkylaniline, benzotriazole or cyclohexylamine. If it is an aliphatic amine, the alkyl substituent must contain a straight chain portion of at least four carbon atoms. Less than four carbon atoms in the chain will render the amine unsuitable for its intended purpose. Apparently, the amine, triazole and aniline function to cover the side portions of the copper walls. If the aliphatic amine contains less than four carbon atoms in the straight chain portion, this function will not be obtained. Suitable long chain amines for this purpose include mono-*n*-butylamine, di-*n*-butylamine, 2-ethylhexylamine, tri-*n*-butylamine, and mono-*n*-octylamine.

The amine acts effectively in amounts of greater than 0.01% w/v and especially in amounts of greater than 0.5% w/v. Preferred ranges are from 0.01–5% and most preferably from 0.5–3% w/v. Greater than 5% w/v will adversely reduce the overall etching rate, since the amine will cover not only the side wall portions of the copper, but also large extends of the copper surface.

Interestingly, the amine, aniline or triazole not only reduces sidewise or lateral etching, but unexpectedly it actually increases the rate of etching. The etch factor when using the etching composition of this invention, is higher than 3.0, as compared with an etch factor of about 1.1 using conventional sulfuric acid-hydrogen peroxide type etching composition. If polyethyleneglycol, preferably having a MW of from 500–2,000 is also added, the etch rate can be enhanced still further.

The basic composition of sulfuric acid and hydrogen peroxide is prepared with 3–30% by weight of sulfuric acid and 2–30%, preferably 5–15% by weight of hydrogen peroxide.

Another interesting aspect of this invention is that although the etching rate for etching copper is significantly decreased when a small amount of halogen is present in a conventional sulfuric acid-hydrogen peroxide type etching composition, this decreased rate is avoided if the amine, benzotriazole or N,N-dialkylaniline is present.

A stabilizer or an etching accelerator may be added to the etching solution without adversely affecting the desirable effects of the composition. For instance, stabilizers, such as phosphoric acid, alcohol, or protein, or etching rate accelerators, such as camphor, acetophenone or quinone, may be used.

By the methods of this invention, a highly accurate etching finish can be obtained so as to provide a highly accurate printed circuit board which is free of accidental short circuits caused by over-hanging provided by excessive sideways or lateral etching. Moreover, in accordance with this invention, no discoloration of the solder coated onto the copper surface occurs, and the cost of etching is relatively inexpensive. The methods of this invention can be used for etching copper or any copper containing alloy, so that it may be used for a variety of etching operations.

Moreover, the nature of the etching solution is such that it is possible to easily recover the etched copper by electrolysis.

Having now generally described the invention, a further understanding will be attained by reference to certain specific Examples which are provided herein for purposes of illustration only and are not intended to be limiting in any manner unless otherwise so specified. In the following Examples, all percentages are weight-/volume unless otherwise noted.

EXAMPLE 1

An etching solution containing 20% w/v of sulfuric acid, 7% w/v of hydrogen peroxide and 0.5% w/v of one of various amines was applied to copper plate partially printed with Pb–Sn solder at 50° C. by spray-etching. The etching rate and the etching factors measured were as shown in Table I. The etch factor was calculated by dividing the thickness of copper by the amount of side-ways or lateral etching.

TABLE I

| Amine | Etching rate, μ/min. | Etch factor |
|---|---|---|
| This invention: | | |
| Mono-n-butylamine | 28.4 | 2.9 |
| Di-n-butylamine | 29.4 | 3.0 |
| 2-ethylhexylamine | 26.6 | 3.0 |
| Cyclohexylamine | 25.7 | 2.5 |
| Reference: | | |
| Mono-n-propylamine | 25.0 | 1.4 |
| Mono-iso-butylamine | 26.7 | 1.2 |
| Methyliminobis-propylamine | 17.7 | 1.1 |
| Thiourea | 17.4 | 1.4 |
| No addition | 24.3 | 1.1 |

EXAMPLE 2

An etching solution containing 15% w/v of sulfuric acid, 10% w/v of hydrogen peroxide and 0.5% w/v of ethylene glycol, 0.04% w/v of benzaldehyde and various amounts of amines was applied to copper plate partially printed with Pb–Sn (30:70) solder according to the conditions of Example 1. The results are shown in Table II.

TABLE II

| Amine | Amount of amine, percent w./v. | Etching rate, μ/min. | Etching factor |
|---|---|---|---|
| Mono-n-butylamine | 0.01 | 35.0 | 1.7 |
| | 0.05 | 35.2 | 2.4 |
| | 0.10 | 35.8 | 2.7 |
| | 0.50 | 36.0 | 2.9 |
| | 1.00 | 35.2 | 3.0 |
| | 2.00 | 30.1 | 3.0 |
| | 5.00 | 19.7 | 3.0 |
| Di-n-butylamine | 0.01 | 35.0 | 1.5 |
| | 0.05 | 35.0 | 1.8 |
| | 0.10 | 35.5 | 2.0 |
| | 0.50 | 35.5 | 3.0 |
| | 1.00 | 34.0 | 2.9 |
| | 2.00 | 31.0 | 3.0 |
| | 5.00 | 17.5 | 2.9 |
| No addition | | 34.0 | 1.1 |

EXAMPLE 3

An etching solution containing 15% w/v of sulfuric acid, 10% w/v of hydrogen peroxide and 1% w/v of one of various amines was applied to copper plate partially printed with Pb–Sn solder at 50° C. by spray-etching.

The same etching solutions were prepared by using tap water to yield a solution containing 0.0007% w/v of chlorine. The results are shown in Table III.

TABLE III

| Amine | Etching rate, μ/min. No chlorine | Etching rate, μ/min. Chlorine | Etch factor |
|---|---|---|---|
| This invention: | | | |
| Mono-n-butylamine | 33.4 | 23.5 | 3.0 |
| Di-n-butylamine | 41.2 | 27.1 | 2.9 |
| Tri-n-butylamine | 20.8 | 22.8 | 2.9 |
| Mono-n-hexylamine | 42.2 | 34.5 | 3.0 |
| Cyclohexylamine | 25.4 | 23.0 | 2.6 |
| Mono-n-octylamine | 21.0 | 18.0 | 2.5 |
| Reference: | | | |
| Mono-tert-butylamine | 30.6 | 2.4 | 1.2 |
| Mono-n-propylamine | 27.3 | 8.4 | 1.4 |
| $AgNO_3$ 0.01% | 35.0 | 35.5 | 1.1 |
| No addition | 34.0 | 2.5 | 1.1 |

Having now fully described the invention, it will be apparent to one of ordinary skill in the art that many changes and modifications can be made thereto without departing from the spirit or scope of the invention as set forth herein.

What is claimed as new and intended to be covered by letters patent is:

1. An etching composition which is useful for etching copper or copper containing alloys which comprises a basic composition of sulfuric acid and hydrogen peroxide and an additive selected from the group consisting of aliphatic or cycloaliphatic amines containing at least four carbon atoms, benzotriazole and N,N-dialkylaniline.

2. The composition of claim 1, wherein the concentration of hydrogen peroxide is 2–30% w/v and the concentration of the additive is 0.01–5% w/v.

3. In a process for selective etching of copper or an alloy containing copper, wherein the surface of said copper or alloy thereof is selectively coated with a resist material, the improvement comprising using an etching solution comprising a basic composition of sulfuric acid and hydrogen peroxide and an additive selected from the group consisting of an aliphatic amine containing at least four carbon atoms, benzotriazole and N,N-dialkylaniline.

4. The process of claim 3, wherein the concentration of sulfuric acid is 3–30% w/v and the concentration of hydrogen peroxide is 2–30% w/v and the concentration of the additive is 0.01–5% w/v.

* * * * *